United States Patent [19]
Higashisaka et al.

[11] Patent Number: 5,859,554
[45] Date of Patent: Jan. 12, 1999

[54] VARIABLE DELAY CIRCUIT

[75] Inventors: Norio Higashisaka; Akira Ohta; Tetsuya Heima, all of Tokyo, Japan

[73] Assignee: Mitsubishi Denki Kabushiki Kaisha, Tokyo, Japan

[21] Appl. No.: 773,234

[22] Filed: Dec. 23, 1996

[30] Foreign Application Priority Data

Jun. 26, 1996 [JP] Japan ................................. 8-166211

[51] Int. Cl.⁶ ............................................. H03K 5/13
[52] U.S. Cl. ............................................ 327/281; 327/288
[58] Field of Search ............................ 327/281, 276–278, 327/284, 285, 288, 269, 270, 271, 272, 261; 326/95, 112

[56] References Cited

U.S. PATENT DOCUMENTS

| | | | |
|---|---|---|---|
| 5,051,630 | 9/1991 | Kogan et al. | 327/281 |
| 5,220,216 | 6/1993 | Woo | 327/278 |
| 5,285,116 | 2/1994 | Thaik | 326/95 |
| 5,430,393 | 7/1995 | Shankar et al. | 327/281 |
| 5,509,040 | 4/1996 | Shimada | 327/118 |

FOREIGN PATENT DOCUMENTS

| | | | |
|---|---|---|---|
| 4-144309 | 5/1992 | Japan | 327/281 |
| 6152343 | 5/1994 | Japan . | |

OTHER PUBLICATIONS

Lewis et al., IBM Technical Disclosure Bulletin, "Variable Delay Driver Circuit"; vol. 22, No. 4, pp. 1405–1406, Sep. 1979.

Primary Examiner—Timothy P. Callahan
Assistant Examiner—Eunja Shin
Attorney, Agent, or Firm—Leydig, Voit & Mayer

[57] ABSTRACT

A variable delay circuit that delays an input signal for a desired time and outputs the delayed signal includes N (N is an integer of 2 or more) load transistors and N control transistors for controlling the load transistors respectively connected in pairs in series to form N load transistor pairs. The load transistor pairs are connected in parallel to form a load transistor group. A switching transistor that is turned on or off according to an input signal input to a gate, and the load transistor group are connected in series between first and second power supplies. The input signal is delayed according to control signals that are respectively input to the control transistors, and a delayed signal is output from a connection node of the load transistor group and the switching transistor. Since no selector is required, a delay circuit operation due to differences in delay times between paths in a selector is avoided, thereby obtaining a variable delay circuit having minute resolution and a good yield.

8 Claims, 6 Drawing Sheets

VARIABLE DELAY CIRCUIT

FIELD OF THE INVENTION

The present invention relates to a variable delay circuit for obtaining a desired timing signal employing a digital circuit and, more particularly, to a variable delay circuit that produces a delay time of minute resolution, the performance of which circuit is improved.

BACKGROUND OF THE INVENTION

A variable delay circuit has a function of delaying an input signal by a certain time and outputting the delayed signal. Delay time can be set by data input from the outside. Such a variable delay circuit is employed for making timing adjustments in such as instruments and communication apparatus, and it can have a variety of structures depending on the variable width and variable resolution of delay time. For example, a variable delay circuit of a digital circuit system having minute variable resolution of several tens of ps (pico seconds) is described below.

FIG. 10 is a block diagram illustrating a prior art four-value digital variable delay circuit having minute resolution. As shown in FIG. 10, this variable delay circuit comprises a common gate 10 for separating input signals $V_{IN}$, wirings 25, 26, 27 and 28 having lengths successively lengthened from the wiring 25 to the wiring 28, driving gates 21, 22, 23 and 24 having outputs that are respectively connected to the wirings 25, 26, 27 and 28, and a selector 29 for selecting the outputs of the driving gates 21, 22, 23 and 24. The gate delay times vary according to the lengths of the wirings 25, 26, 27 and 28 that are respectively connected to the outputs of the driving gates 21, 22, 23 and 24. Utilizing these various delay times, delay signals respectively having slight time differences are produced to select a desired signal out of the delay signals with a control signal $V_{CONT}$ of the selector 29, whereby a desired variable delay output is obtained. In the prior art variable delay circuit, by appropriately selecting the lengths of the wirings 25, 26, 27 and 28 that are respectively connected to the driving gates 21, 22, 23 and 24, delay time difference of several tens of ps to several ps is produced and, in theory, it is possible to obtain a variable delay circuit having delay resolution of several tens of ps to several ps.

However, the prior art variable delay circuit has the problems described below.

More specifically, since the prior art variable delay circuit selects one of the driving gate outputs with the selector, delay resolution desired for the whole delay circuit cannot be obtained due to the delay time differences between paths in the selector. For example, even when the lengths of the wirings 25, 26, 27 and 28 are designed so that the delay times of the outputs of the driving gates 21, 22, 23 and 24 successively increase by 25 ps, if there is delay time difference of about 50 ps between the paths in the selector, a variable delay of 25 ps for the whole delay circuit is not produced.

Further, the delay between the paths in the selector is mostly due to the differences in threshold voltage $V_{th}$ between transistors constituting the selector. Therefore, the delay time difference between the paths in each IC chip is different, whereby it is impossible to correct the differences by circuit design, so that the prior art variable delay circuit is poor in yield.

SUMMARY OF THE INVENTION

It is an object of the present invention to provide a variable delay circuit having minute resolution and a good yield.

Other objects and advantages of the present invention will become apparent from the detailed description given hereinafter; it should be understood, however, that the detailed description and specific embodiment are given by way of illustration only, since various changes and modifications within the scope of the invention will become apparent to the those skilled in the art from this detailed description.

According to a first aspect of the present invention, in a variable delay circuit that delays an input signal for a desired time and outputs the delayed signal, N pieces (N is an integer of 2 or more) of load transistors and control transistors for controlling the load transistors are respectively connected in series to form N load transistor pairs. These load transistor pairs are connected in parallel to form a load transistor group. A switching transistor that is turned on or off according to an input signal input to a gate, and the load transistor group are connected in series between first and second power supplies. The input signal is delayed according to control signals that are respectively input to the control transistors, and a delayed signal is output from a connection node of the load transistor group and the switching transistor. Consequently, because no selector is required, it is possible to solve delay circuit operation due to the differences in delay time between paths in a selector, whereby a variable delay circuit having minute resolution and a good yield is obtained.

According to a second aspect of the present invention, in the above-described variable delay circuit, the load transistors in the N load transistor pairs constitute a binary sequence. Consequently, it is obtainable a variable delay circuit having minute resolution and a good yield, in which the variable stage number can be increased with a small number of elements.

According to a third aspect of the present invention, in the above-described variable delay circuit, current limiting means are respectively provided at the N load transistor pairs. Consequently, it is obtainable a variable delay circuit having minute resolution and a good yield, in which the variable stage number can be increased extremely easily.

According to a fourth aspect of the present invention, in the above-described variable delay circuit, current limiting capacities of the current limiting means constitute a binary sequence. Consequently, it is obtainable a variable delay circuit having minute resolution and a good yield, in which the variable stage number can be increased with a small number of elements.

According to a fifth aspect of the present invention, in the above-described variable delay circuit, drain electrodes of the load transistors and source electrodes of the control transistors forming counterparts to the load transistors in the N load transistor pairs, respectively comprise a common electrode. Consequently, it is possible to improve integration level of a variable delay circuit having minute resolution and a good yield.

DETAILED DESCRIPTION OF THE PREFERRED EMBODIMENT

[Embodiment 1]

Figure 1:
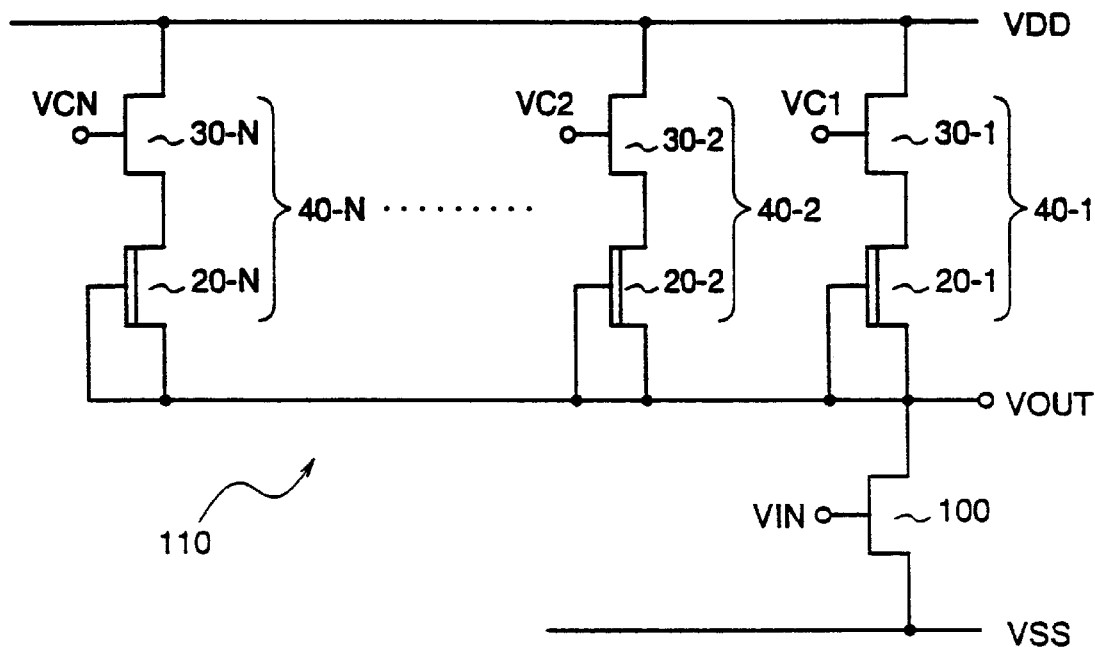
FIG. 1 is a block diagram illustrating a variable delay circuit in accordance with a first embodiment of the present invention.
Figure 2:
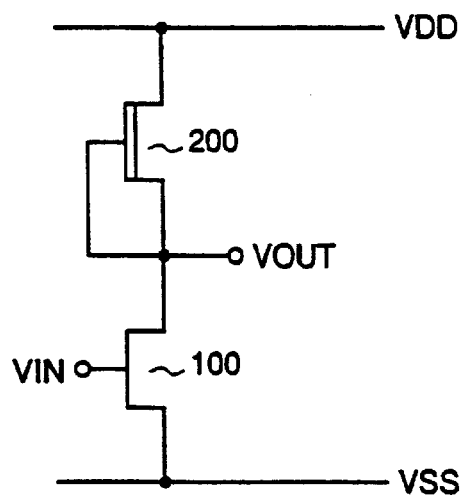
FIG. 2 is a block diagram illustrating a logical circuit of DCFL (direct coupled field effect transistor logic).

FIG. 1 is a block diagram illustrating a variable delay circuit according to a first embodiment of the present invention. The variable delay circuit of the first embodiment is a modification of a logical circuit called DCFL (direct coupled field effect transistor logic) as shown in FIG. 2. A load transistor 200 shown in FIG. 2 is divided into N load transistors 20-1, 20-2, . . . 20-N, and control transistors 30-1, 30-2, . . . 30-N are respectively added to the load transistors 20-1, 20-2, . . . 20-N, thereby forming N load transistor pairs 40-1, 40-2, . . . 40-N. These load transistor pairs 40-1, 40-2, . . . 40-N are connected in parallel to form a load transistor group 110. Control inputs VC1, VC2, . . . VCN for controlling the control transistors are respectively input to the gates of the control transistors 30-1, 30-2, . . . 30-N. An input signal to be delayed is input to the gate of a switching transistor 100 and is delayed for a desired time to output the delayed signal from the connection node of the load transistor group 110 and the switching transistor 100.

A description is given of the operation.

Figure 3:
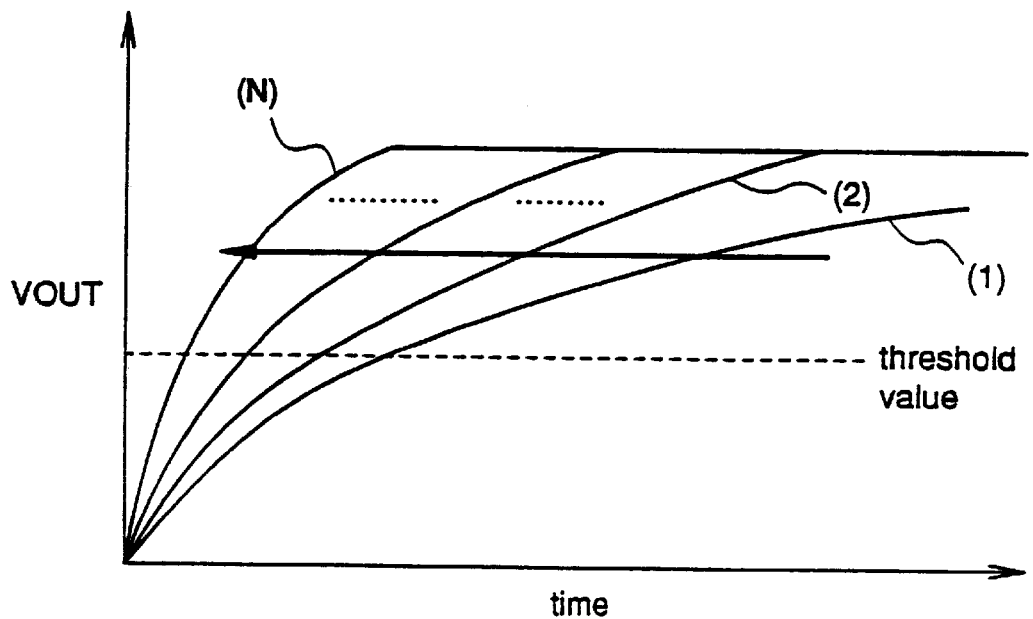
FIG. 3 is a diagram showing the rise characteristics of the variable delay circuit according to the first embodiment of the invention.

FIG. 3 is a diagram showing the leading characteristics of the variable delay circuit according to the first embodiment of the invention. The ordinate represents an output voltage, and the abscissa represents time. A curve (1) shown in FIG. 3 shows the characteristic when only the control input VC1 is in the ON state, i.e., when only the control input VC1 makes the load transistor operate. A curve (2) shown in the figure shows the characteristic when the control inputs VC1 and VC2 are in the ON state. A curve (N) shown in the figure shows the characteristic when all of the control inputs VC1, VC2, . . . VCN are in the ON state. That is, FIG. 3 shows the respective leading characteristics when the number of control inputs in the ON state increases in a direction shown by an arrow in the figure.

When only VC1 is in the ON state, i.e., when only the load transistor 20-1 operates, the current for charging the capacitance that is added to an output terminal is limited to the current flowing through the load transistor 20-1. Therefore, as shown by the curve (1) in FIG. 3, it takes longer to charge the capacitance added to the output terminal, so that it is later in reaching a threshold value of the gate input at the next stage. However, when the number of load transistors operating increases by increasing the number of control inputs that are in the ON state, i.e., in the direction shown by the arrow in FIG. 3, the charging of the capacitance added to the output terminal is rapidly performed, whereby the time needed to reach the threshold value of the gate input at the next stage is reduced. Consequently, by adjusting the number of control inputs that are in the ON state, an input signal can be delayed for a desired time to produce an output signal.

In the first embodiment of the invention, although there is described a case where the leading edge of the input signal is used, this variable delay circuit may apply in a case where the trailing edge of the input signal is utilized. In this case, the delay time of the input signal depends on the difference between the current captured from the capacitance being added to the output terminal to the VSS and the current flowing from the load transistor group 110 to the VSS. More specifically, a decrease in the number of control inputs that are in the ON state decreases the number of the load transistors operating, so that the current flowing from the load transistor group 110 to the VSS decreases. Thus, the current captured from the added capacitance to the VSS increases, whereby the discharge speed of electronic charges in the added capacitance that is charged increases and the time needed to reach the threshold value of the gate input at the next stage is reduced. Consequently, by decreasing the number of control inputs that are in the ON state, a fast trailing signal, i.e., a signal having less delay time, is obtained.

As described above, in the variable delay circuit according to the first embodiment of the invention, N (N is an integer of 2 or more) of the load transistors 20-1, 20-2, . . . 20-N and the control transistors 30-1, 30-2, . . . 30-N for controlling the load transistors are respectively connected in series to form the N load transistor pairs 40-1, 40-2, . . . 40-N. These load transistor pairs 40-1, 40-2, . . . 40-N are connected in parallel to form the load transistor group 110. The switching transistor 100 that is turned on or off according to an input signal input to the gate, and the load transistor group 110 are connected in series between the first and the second power supplies. The input signal is delayed according to the control signals respectively input to the control transistors 30-1, 30-2, . . . 30-N, and the delayed signal is output from the connection node of the load transistor group 110 and the switching transistor 100. Consequently, since no selector is required, delay circuit operation due to differences in delay times of different paths in a selector is avoided, thereby obtaining a variable delay circuit having minute resolution and a good yield.

[Embodiment 2]

Figure 4:
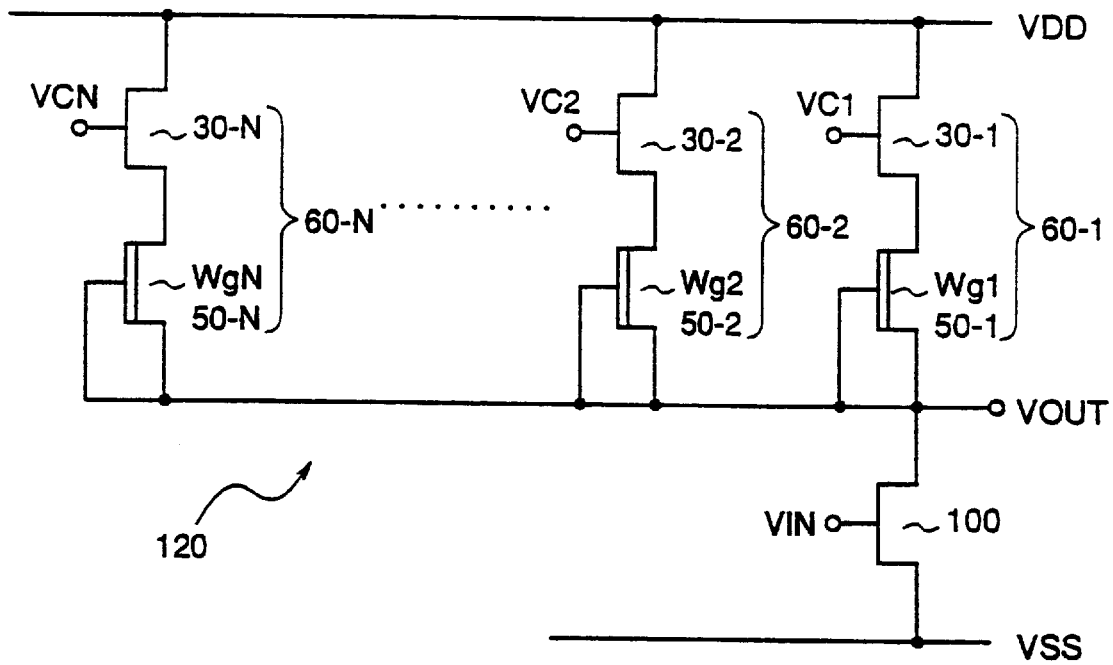
FIG. 4 is a block diagram illustrating a variable delay circuit in accordance with a second embodiment of the present invention.

FIG. 4 is a block diagram illustrating a variable delay circuit according to a second embodiment of the present invention. In the variable delay circuit according to the first embodiment, the size is the same for all load transistors, as shown in FIG. 1. In the variable delay circuit according to the second embodiment, however, the sizes of load transistors 50-1, 50-2, . . . 50-N are respectively changed to Wg1, Wg2, . . . WgN, the ratio of which is $1:2:4: \ldots :2^N$, i.e., a binary sequence.

A description is given of the operation of the variable delay circuit according to the second embodiment, taking a variable delay circuit of sixteen stages as an example.

Figure 5:
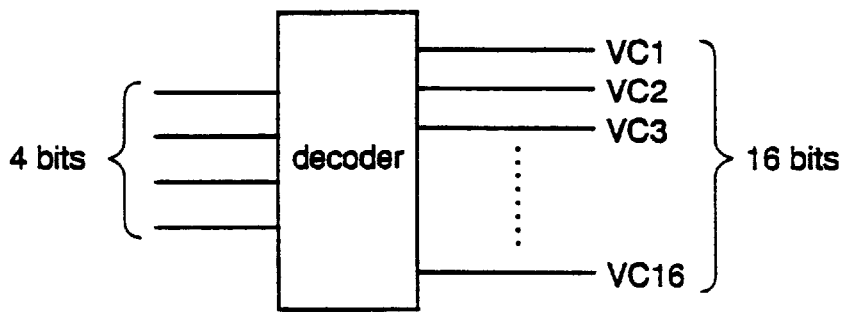
FIG. 5 is a diagram for explaining the operation of the variable delay circuit according to the second embodiment of the invention.

In the first embodiment of the invention, in order to constitute a variable delay circuit of sixteen stages, sixteen load transistors and sixteen control transistors are required. Additionally, as shown in FIG. 5, a decoder is necessary for converting four bit signals into sixteen bit control signals, in order to input the four bit control signals to the sixteen control transistors. On the other hand, the variable delay circuit according to the second embodiment requires only four load transistors in the size ratio of 1:2:4:8, and four control transistors, to realize a variable delay circuit of sixteen stages. Further, no decoder is required. These features enable a reduction in the area of a circuit.

As described above, in the variable delay circuit according to the second embodiment of the invention, N (N is an integer of 2 or more) of the load transistors 50-1, 50-2, . . . 50-N and the control transistors 30-1, 30-2, . . . 30-N for controlling the load transistors are respectively connected in series to form N load transistor pairs 60-1, 60-2, . . . 60-N. These load transistor pairs 60-1, 60-2, . . . 60-N are connected in parallel to form a load transistor group 120. The switching transistor 100 that is turned on or off according to an input signal input to the gate, and the load transistor group 120 are connected in series between the first and the second power supplies. The input signal is delayed according to control signals that are respectively input to the control transistors 30-1, 30-2, . . . 30-N, and the delayed signal is output from the connection node of the load transistor group 120 and the switching transistor 100. Further, the sizes of the load transistors 50-1, 50-2, . . . 50-N are in the ratio of 1:2:4: . . . :$2^N$, i.e., a binary sequence. Consequently, it is obtainable a variable delay circuit having minute resolution and a good yield, in which the variable stage number can be increased with a small number of elements, is obtained.

[Embodiment 3]

Figure 6:
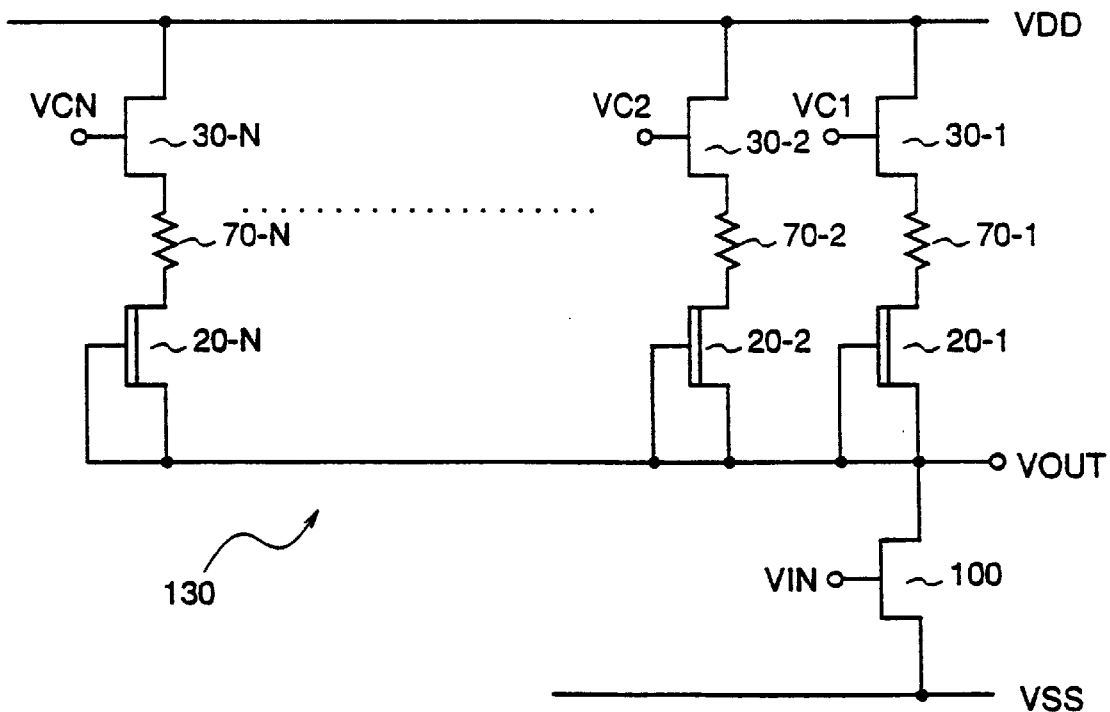
FIG. 6 is a block diagram illustrating a variable delay circuit in accordance with a third embodiment of the present invention.

FIG. 6 is a block diagram illustrating a variable delay circuit according to a third embodiment of the present invention. This variable delay circuit according to the third embodiment is characterized in that limiting resistors 70-1, 70-2, . . . 70-N are respectively interposed between the load transistors 20-1, 20-2, . . . 20-N and the control transistors 30-1, 30-2, . . . 30-N in the variable delay circuit according to the first embodiment.

In the variable delay circuit of the first embodiment, the load transistor is divided into N parts, and these load transistors are connected in parallel to form the load transistor group. Actually, however, the division of the transistors cannot be so much increased because of the minimum transistor size allowed in fabrication. The division is limited to about N<4 in practice. Therefore, the first embodiment has the disadvantage that the number of variable stages of the variable delay circuit cannot be increased.

The variable delay circuit according to the third embodiment copes with the above-described problem. In this circuit, the limiting resistors are respectively connected between the load transistors and the control transistors, whereby the variable stage number is increased.

More specifically, in order to increase the number of variable stages of the variable delay circuit of the first embodiment, it is required to reduce the current flow per a single load transistor and to increase the division of the load transistors. Generally, the transistor size is reduced or the gate length is increased, whereby the current capacity of the transistor is reduced. As described above, however, there is a limitation in reducing the transistor size in fabrication. In addition, if the current flow is reduced by varying the gate lengths, transistors of different gate lengths must be fabricated in one IC chip, resulting in increased inconvenience in the fabricating process.

Meanwhile, in the variable delay circuit of the third embodiment, the current flow in the load transistors is reduced by connecting the limiting resistors. Accordingly, it is possible to increase the division of the load transistors without varying the transistor sizes and the gate lengths.

As described above, in the variable delay circuit according to the third embodiment of the invention, N (N is an integer of 2 or more) of the load transistors 20-1, 20-2, . . . 20-N, and the control transistors 30-1, 30-2, . . . 30-N for controlling the load transistors are respectively connected in series to form the N load transistor pairs 40-1, 40-2, . . . 40-N. These load transistor pairs 40-1, 40-2, . . . 40-N are connected in parallel to form a load transistor group 130. The switching transistor 100 that is turned on or off according to an input signal input to the gate, and the load transistor group 130 are connected in series between the first and the second power supplies. The input signal is delayed according to control signals that are respectively input to the control transistors 30-1, 30-2, . . . 30-N, and the delayed signal is output from the connection node of the load transistor group 130 and the switching transistor 100. Further, limiting resistors 70-1, 70-2, . . . 70-N are respectively connected between the load transistors 20-1, 20-2, . . . 20-N and the control transistors 30-1, 30-2, . . . 30-N. Consequently, a variable delay circuit having minute resolution and a good yield, in which the number of variable stages can be increased extremely easily, is obtained.

Figure 7:
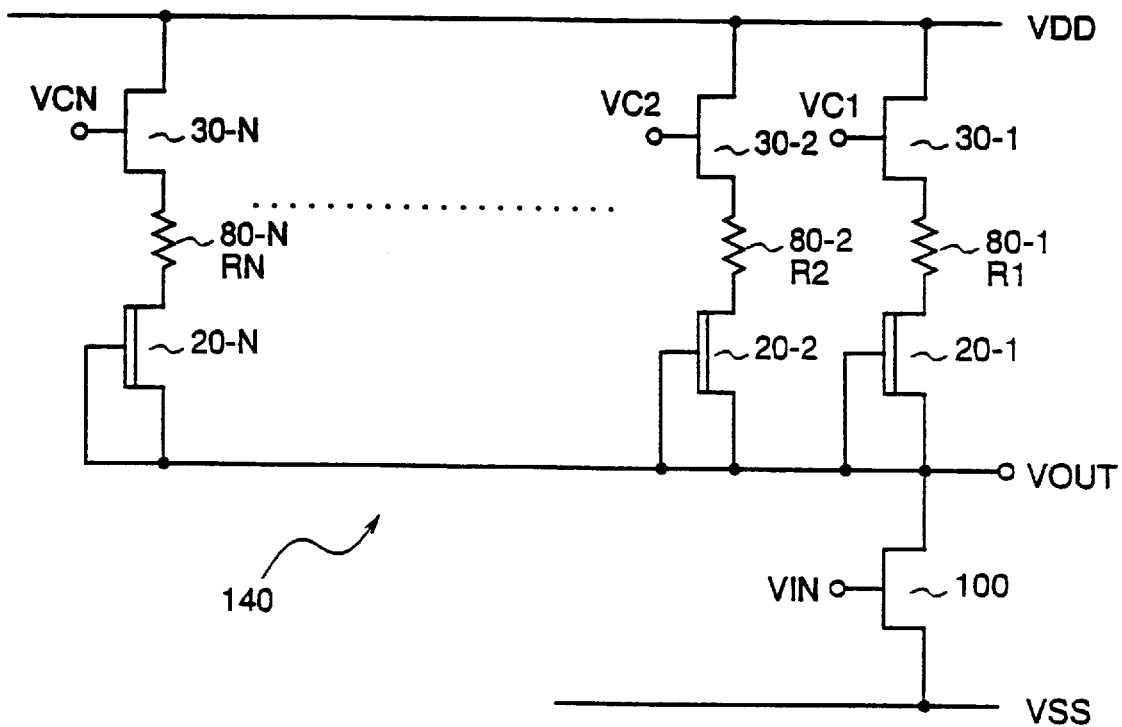
FIG. 7 is a block diagram illustrating another variable delay circuit according to the third embodiment of the invention.

In the third embodiment of the invention, the resistance values of the limiting resistors that are respectively connected between the load transistors and the control transistors are the same. As shown in FIG. 7, however, resistance values R1, R2, . . . RN of limiting resistors 80-1, 80-2, . . . 80-N may be in the ratio of 1:2:4: . . . :$2^N$, i.e., a binary sequence, whereby a variable delay circuit, in which the number of variable stages is increased with a small number of elements, can be obtained as in the second embodiment of the invention.

Although the third embodiment of the invention describes taking the variable delay circuit of the first embodiment which includes the limiting resistors as an example, this may also apply to the variable delay circuit of the second embodiment. As a result, there is obtained a variable delay circuit in which the number of variable stages is increased with a small number of elements, as in the third embodiment of the invention.

[Embodiment 4]

Figure 8:
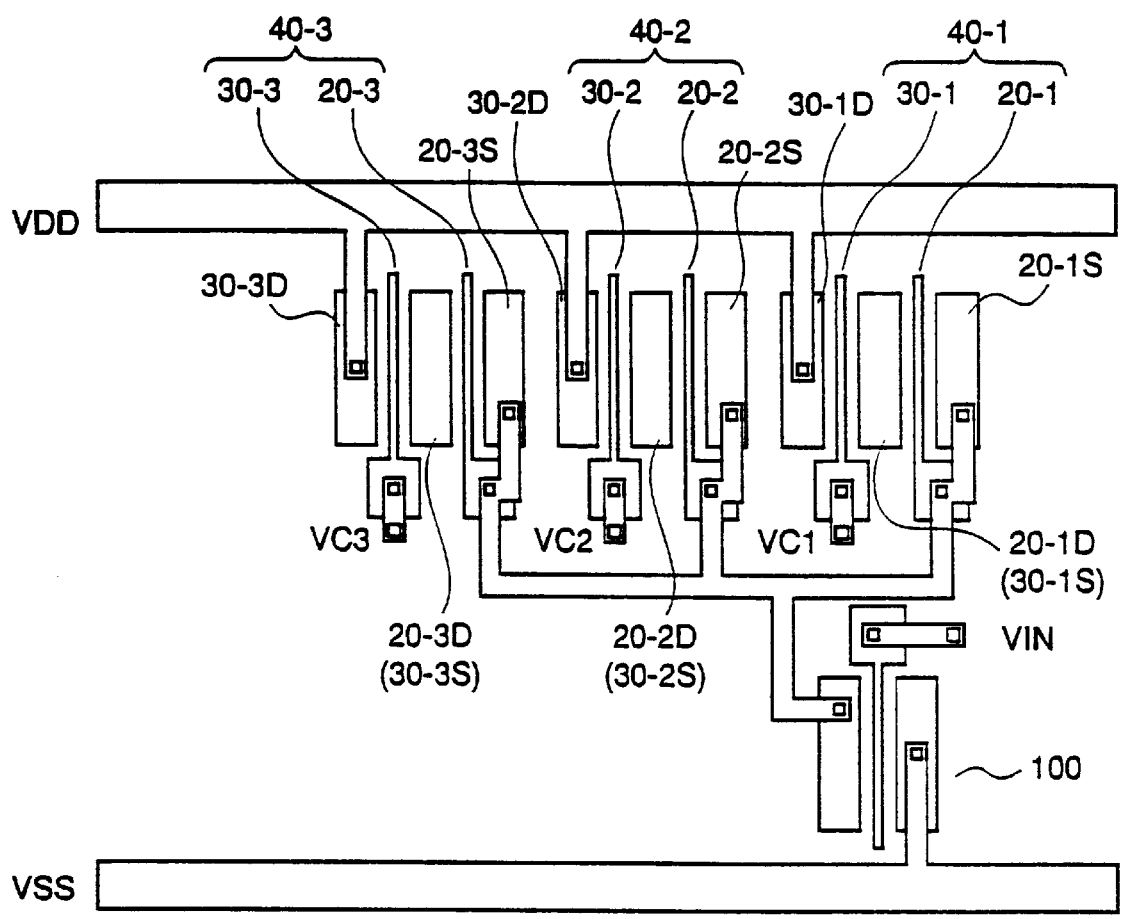
FIG. 8 is a diagram illustrating an integrated circuit pattern of a variable delay circuit in accordance with a fourth embodiment of the present invention.

FIG. 8 is a diagram illustrating an integrated circuit pattern of a variable delay circuit according to a fourth embodiment of the present invention. This fourth embodiment relates to improved integration density of the variable delay circuit according to the first embodiment of the invention.

Figure 9:
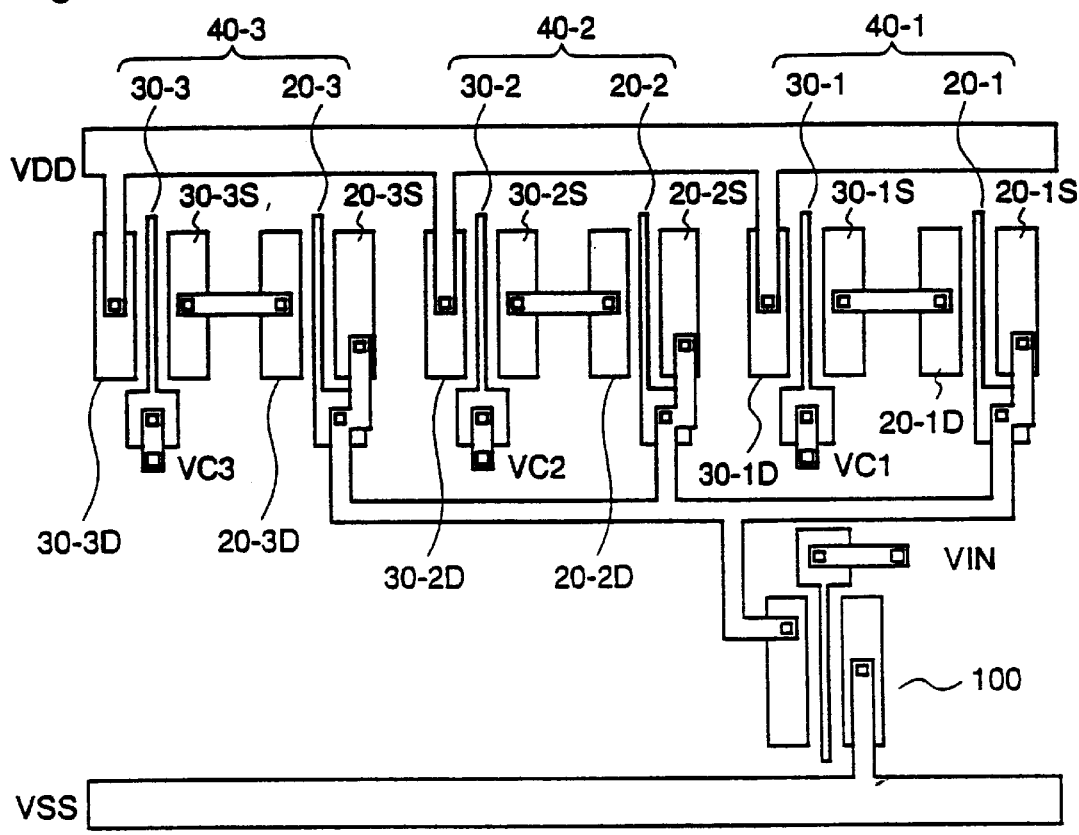
FIG. 9 is a diagram illustrating a general integrated circuit pattern of the variable delay circuit according to the first embodiment of the invention.
Figure 10:
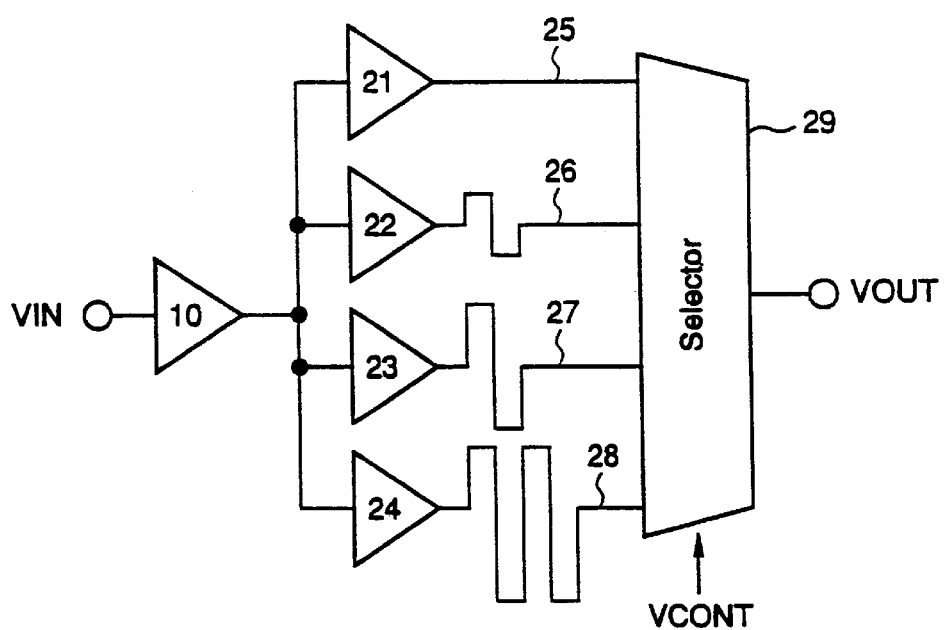
FIG. 10 is a block diagram illustrating a four-value digital variable delay circuit having minute resolution according to the prior art.

When the variable delay circuit of the first embodiment is integrated, an integrated circuit pattern shown in FIG. 9 is generally employed. In this integrated circuit pattern, however, since individual transistors are separately arranged as shown in the figure, the circuit area is increased.

Meanwhile, in the variable delay circuit of the fourth embodiment, the drain electrodes 20-1D, 20-2D and 20-3D of the load transistors 20-1, 20-2 and 20-3 are also used as the source electrodes 30-1S, 30-2S and 30-3S of the control transistors 30-1, 30-2 and 30-3 forming counterparts of the load transistors 20-1, 20-2 and 20-3, respectively.

As described above, the variable delay circuit according to the fourth embodiment is characterized in that, in the variable delay circuit of the first embodiment, the drain electrode 20-1D of the load transistor 20-1 and the source electrode 30-1S of the control transistor 30-1, which constitute the load transistor pair 40-1, comprise a common electrode and, similarly, the drain electrodes 20-2D and 20-3D of the load transistors 20-2 and 20-3, and the source electrodes 30-2S and 30-3S of the control transistors 30-2 and 30-3, which constitute the respective load transistor pairs 40-2 and 40-3, respectively comprise a common electrode. Consequently, it is possible to improve the integration density of a variable delay circuit having minute resolution and a good yield.

Although the fourth embodiment of the invention describes taking the variable delay circuit of the first embodiment as an example, this embodiment may also be applied to the variable delay circuits of the second or third embodiment. As a result, it is possible to improve integration density of a variable delay circuit as in the fourth embodiment of the invention.

What is claimed is:

1. A variable delay circuit that delays an input signal for a desired time and outputs a delay signal comprising:

N (N is an integer and at least 2) load transistors and N control transistors for controlling respective load transistors, each of the load and control transistors having an input electrode, an output electrode, and a control electrode, the control and output electrodes of each of the load transistors being connected together, respective load and control transistors being connected in series at the output electrode of the control transistor and the input electrode of the load transistor as N load transistor pairs, the N load transistor pairs being connected in parallel to form a load transistor group; and a switching transistor turned on and off in response to a signal input to a gate of the switching transistor, the load transistor group and the switching transistor being connected in series at the control electrodes of the load transistors and an input electrode of the switching transistor, between first and second power supplies, wherein the signal input is delayed in response to control signals respectively input to the control electrodes of the N control transistors, and the delayed signal input is output from a connection node of the load transistor group and the input electrode of the switching transistor.

2. The variable delay circuit of claim 1 wherein the load transistors in the N load transistor pairs have respective sizes and the sizes vary in a binary sequence.

3. A variable delay circuit that delays an input signal for a desired time and outputs a delay signal comprising:

N (N is an integer and at least 2) load transistors, N control transistors for controlling respective load transistors, and N current limiting means, each of the load and control transistors having an input electrode, an output electrode, and a control electrode, the control and output electrodes of each of the load transistors being connected together, respective load transistors, current limiting means, and control transistors being connected in series, the current limiting means being connected between the output electrode of the control transistor and the input electrode of the load transistor, as N load transistor pairs, the N load transistor pairs being connected in parallel to form a load transistor group; and a switching transistor turned on and off in response to a signal input to a gate of the switching transistor, the load transistor group and the switching transistor being connected in series at the control electrodes of the load transistors and an input electrode of the switching transistor, between first and second power supplies wherein the signal input is delayed in response to control signals respectively input to the control electrodes of the N control transistors, and the delayed signal input is output from a connection node of the load transistor group and the input electrode of the switching transistor.

4. A variable delay circuit that delays an input signal for a desired time and outputs a delay signal comprising:

N (N is an integer and at least 2) load transistors, N control transistors for controlling respective load transistors, and N current limiting means, each of the load and control transistors having an input electrode, an output electrode, and a control electrode, the control and output electrodes of each of the load transistors being connected together, respective load transistors, current limiting means, and control transistors being connected in series, the current limiting means being connected between the output electrode of the control transistor and the input electrode of the load transistor, as N load transistor pairs, the N load transistor pairs being connected in parallel to form a load transistor group, the load transistors in the N load transistor pairs having respective sizes and the sizes varying in a binary sequence; and a switching transistor turned on and off in response to a signal input to a gate of the switching transistor, the load transistor group and the switching transistor being connected in series at the control electrodes of the load transistors and an input electrode of the switching transistor, between first and second power supplies wherein the signal input is delayed in response to control signals respectively input to the control electrodes of the N control transistors, and the delayed signal input is output from a connection node of the load transistor group and the input electrode of the switching transistor.

5. The variable delay circuit of claim 3 wherein current limiting capacities of the current limiting means in the N load transistor pairs vary in a binary sequence.

6. The variable delay circuit of claim 4 wherein current limiting capacities of the current limiting means in the N load transistor pairs vary in a binary sequence.

7. The variable delay circuit of claim 1 wherein input electrodes of the load transistors and output electrodes of the control transistors in the N load transistor pairs respectively comprise common electrodes.

8. The variable delay circuit of claim 2 wherein input electrodes of the load transistors and output electrodes of the control transistors in the N load transistor pairs respectively comprise common electrodes.

* * * * *